(12) United States Patent
Cho

(10) Patent No.: US 7,436,654 B2
(45) Date of Patent: Oct. 14, 2008

(54) PLASMA DISPLAY MODULE

(75) Inventor: In-Soo Cho, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 130 days.

(21) Appl. No.: 11/633,018

(22) Filed: Dec. 4, 2006

(65) Prior Publication Data

US 2007/0126328 A1 Jun. 7, 2007

(30) Foreign Application Priority Data

Dec. 6, 2005 (KR) ...................... 10-2005-0117843

(51) Int. Cl.
*G06F 1/16* (2006.01)
*H05K 5/00* (2006.01)
*H05K 7/00* (2006.01)

(52) U.S. Cl. .................................... 361/681

(58) Field of Classification Search ................ 361/681, 361/736, 752, 760, 810, 758
See application file for complete search history.

(56) References Cited

U.S. PATENT DOCUMENTS 7,357,645 B2 * 4/2008 Jeong et al. .................... 439/66

FOREIGN PATENT DOCUMENTS

| JP | 10-143083 | 5/1998 |
|---|---|---|
| KR | 10-2004-0024411 | 3/2004 |

* cited by examiner

*Primary Examiner*—Javaid Nasri
(74) *Attorney, Agent, or Firm*—Robert E. Bushnell, Esq.

(57) ABSTRACT

A plasma display module having an improved grounding structure suitable for manufacturing a lightweight and slim plasma display module. The plasma display module includes: a chassis base formed of a plastic material; a plasma display panel disposed in front of the chassis base to display images; a plurality of circuit substrates disposed on a rear surface of the chassis base to drive the plasma display panel; a grounding member which is disposed corresponding to the circuit substrates so that the chassis base is disposed between the grounding member and the circuit substrates and is formed of a conductive material so that the grounding member can provide a ground voltage to the circuit substrates grounded to the grounding member; and a screw member that electrically connects the circuit substrates to the grounding member through the chassis base and fixes the circuit substrates to the chassis base.

20 Claims, 5 Drawing Sheets

FIG. 1 *(Background Art)*

PLASMA DISPLAY MODULE

CLAIM OF PRIORITY

This application makes reference to, incorporates the same herein, and claims all benefits accruing under 35 U.S.C. §119 from an application for PLASMA DISPLAY MODULE earlier filed in the Korean Intellectual Property Office on 6 Dec. 2005 and there duly assigned Serial No. 10-2005-00117843.

BACKGROUND OF THE INVENTION

1. Field of the Invention

The present invention relates to a plasma display module, and more particularly, to a plasma display module having an improved circuit substrate grounding structure suitable to be used to manufacture a slim and light weighted display module.

2. Description of the Related Art

Plasma display modules are flat panel display modules that display images by using a discharge effect. Due to their very good characteristics, such as high display capacity, high brightness, high contrast, high performance, clear latent images, wide viewing angles, slim structure, and large screen size, plasma display devices are considered to be the next generation display devices which will replace cathode ray tubes (CRTs).

A plasma display module includes a plasma display panel forming a front portion of the plasma display module to display images and a chassis base that supports the plasma display panel from a rear side of the plasma display panel. Circuit substrates that generate predetermined driving signals to be applied to the plasma display panel are mounted on a rear surface of the chassis base. The driving signals generated by the circuit substrates are transmitted to the plasma display panel through connection cables.

A heat dissipation sheet for transmitting heat generated by the operation of the plasma display panel to the chassis base may be interposed between the plasma display panel and the chassis base. A strip of double-sided tape that intermediates the coupling of the plasma display panel with the chassis base may be interposed between the plasma display panel and the chassis base in areas where the heat dissipation sheet is not interposed. The chassis base serves as a heat dissipation plate that dissipates heat transferred from the plasma display panel to the outside through by natural convection of air over an outer surface of the chassis base. At the same time the chassis base functions as a supporter that supports the plasma display panel disposed in front of the chassis base and the circuit substrates disposed on a rear surface of the chassis base. Therefore, the chassis base should have a mechanical strength greater than a predetermined level to safely protect the plasma display panel and the circuit substrates from an unexpected external impact. Meanwhile, the chassis base, formed of an electrically conductive material, has a wide area to provide a grounding region that maintains a constant ground voltage, and the circuit substrates mounted on the rear surface of the chassis base have a grounding structure that may be directly electrically connected to the chassis base through screw members coupled to the chassis base.

To manufacture the chassis base, a method of die-casting or pressing an aluminum material to a predetermined shape may be used. Accordingly, the cost of raw materials required may be high, thereby increasing manufacturing costs. Also, the chassis base formed of an aluminum material may be susceptible to bending or twisting due to its material characteristics. Therefore, when an external impact is applied to the plasma display module during transportation or moving, the plasma display panel and the circuit substrates cannot be protected by the chassis base, and therefore, may be damaged by the external impact. In particular, as the size of the plasma display panel increases, the size of the chassis base, which is proportional to the size of the plasma display panel, also increases, and therefore, becomes more susceptible to bending or twisting. Therefore, an additional reinforcing structure or reinforcing member for protecting the plasma display panel may be required.

Also, in that situation, the thickness of the chassis base, generally formed of aluminum, must be increased to ensure a predetermined strength. However, the increased thickness is undesirable for making a slim display module. Furthermore, the chassis base, formed of an aluminum material having a specific gravity of approximately 2.7, increases the total weight of the display module. Overall, the chassis base, formed of an aluminum material, may be a limiting factor in making a lightweight and slim plasma display module.

Recently, plastic materials are drawing attention as a new material for forming the chassis base since plastic materials having high strength are advantageous for making lightweight yet strong and slim display modules. However, when an insulating plastic material is used for manufacturing the chassis base, the circuit substrates cannot be grounded by conventional grounding method. Therefore, a new grounding structure for grounding the circuit substrates is required.

SUMMARY OF THE INVENTION

The present invention provides a plasma display module having a circuit substrate grounding structure suitable for manufacturing a light weighted and slim plasma display module.

According to an aspect of the present invention, there is provided a plasma display module comprising a chassis base formed of a non-metallic material; a plasma display panel disposed in front of the chassis base to display images; a plurality of circuit substrates disposed on a rear surface of the chassis base to drive the plasma display panel; a grounding member disposed between the chassis base and the plasma display panel, the grounding member being formed of a conductive material so that the grounding member can provide a ground voltage to the circuit substrates when the circuit substrates are grounded to the grounding member; and a plurality of screw members fixing the circuit substrates to the chassis base, at least one of the screw members grounding circuit substrates to the grounding member by electrically connecting the circuit substrates to the grounding member through the chassis base.

According to the present invention the plasma display module further comprises a flexible connection member having a buffering capability together with electrical conductivity, the flexible connection member being interposed between the chassis base and the grounding member, the flexible connection member forming an electrical connection between the at least one screw member and the grounding member, wherein the at least one screw member protrudes a predetermined distance from the chassis base so that the screw member can elastically press the flexible connection member against the grounding member, and the flexible connection member is formed of a sponge and a metal mesh that surrounds the sponge.

Additionally, the plasma display module further comprises a flexible thermal conductive member having a buffering capability together with thermal conductivity, the flexible thermal conductive member being tightly sandwiched between the chassis base and the grounding member so that the flexible thermal conductive member can intermediate heat transfer from the chassis base to the grounding member, wherein the flexible thermal conductive member is formed of silicon sheet.

Preferably, the grounding member has a high degree of thermal conductivity for rapidly diffusing heat generated from the plasma display panel, and is made of a metal plate such as aluminum having a thermal conductivity of 140 W/mk.

Preferably the chassis base comprises: a plurality of recesses formed in a rear surface area of the chassis base for receiving the plurality of circuit substrates; and a plurality of coupling bosses for receiving the plurality of screw members, the coupling bosses being formed as an integral part of the chassis base protruding from the recesses. In addition, the chassis base comprises a plurality of ribs framing the plurality of recesses, the ribs providing added strength and rigidity to the chassis base. Further, the non-metallic material forming the chassis base is preferably comprised of a plastic material, a thermoplastic resin material or a thermosetting resin material.

According to another aspect of the present invention, there is provided a plasma display module comprising: a plasma display panel; a chassis base formed of a non-metallic material, the chassis base being fastened to the plasma display panel by double sided tape disposed adjacent outer edges of the plasma display panel; a plurality of circuit substrates disposed on a rear surface of the chassis base to drive the plasma display panel; a grounding member disposed between the plasma display panel and the chassis base, the grounding member being formed of a conductive material; and a plurality of screw members fixing the plurality of circuit substrates to the chassis base, at least one of the screw members grounding the circuit substrates to the grounding member by electrically connecting the circuit substrates to the grounding member through the chassis base, wherein the non-metallic material forming the chassis base is comprised of a plastic material, a thermoplastic resin material or a thermosetting resin material.

Additionally, the chassis base comprises: a plurality of recesses formed in a rear surface area of the chassis base for receiving the plurality of circuit substrates; a plurality of coupling bosses for receiving the plurality of screw members, the coupling bosses being formed as an integral part of the chassis base protruding from the recesses, and a plurality of ribs framing the plurality of recesses, the ribs providing added strength and rigidity to the chassis base.

Further, the plasma display module comprises: flexible connection members having a buffering capability together with electrical conductivity, the flexible connection members being tightly sandwiched between the chassis base and the grounding member, at least one of the flexible connection members forming an electrical connection between the at least one screw member and the grounding member; and a flexible thermal conductive member disposed between the flexible connection members, the flexible thermal conductive member having a buffering capability together with thermal conductivity, the flexible thermal conductive member being tightly sandwiched between the chassis base and the grounding member so that the flexible thermal conductive member can intermediate heat transfer from the chassis base to the grounding member.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings in which exemplary embodiments of the invention are shown.

Figure 1:
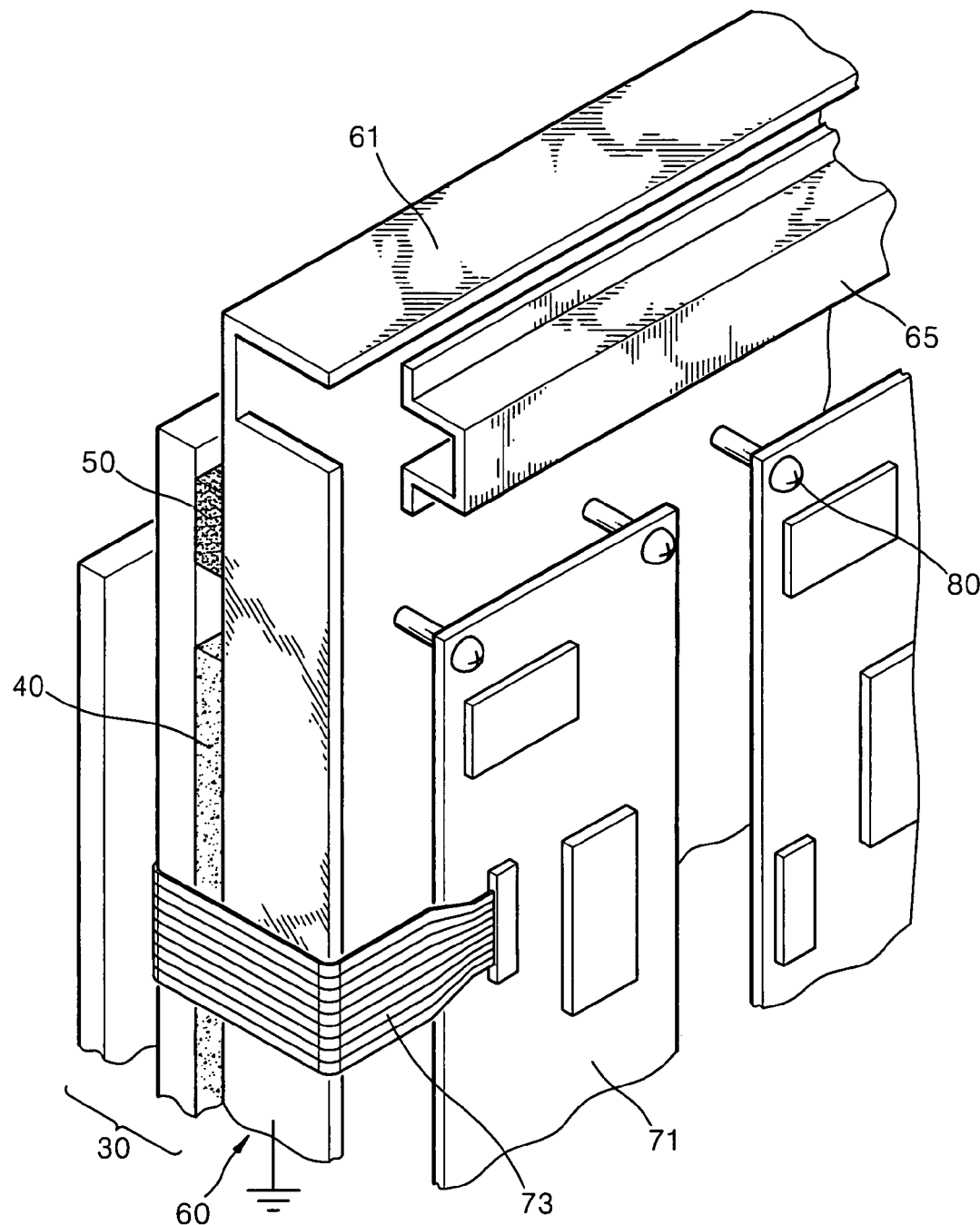
FIG. 1 is a partial perspective view of an example of a plasma display module.

FIG. 1 is a perspective view of an example of plasma display module. The plasma display module includes a plasma display panel 30 forming a front portion of the plasma display module to display images and a chassis base 60 that supports the plasma display panel 30 from a rear side of the plasma display panel 30. Circuit substrates 71 that generate predetermined driving signals to be applied to the plasma display panel 30 are mounted on a rear surface of the chassis base 60. The driving signals generated by the circuit substrates 71 are transmitted to the plasma display panel 30 through connection cables 73.

A heat dissipation sheet 40 for transmitting heat generated by the operation of the plasma display panel 30 to the chassis base 60 is interposed between the plasma display panel 30 and the chassis base 60. A strip of double-sided tape 50 that intermediates the coupling of the plasma display panel 30 with the chassis base 60 is interposed between the plasma display panel 30 and the chassis base 60 in areas where the heat dissipation sheet 40 is not interposed. The chassis base 60 serves as a heat dissipation plate that dissipates heat transferred from the plasma display panel 30 to the outside through by natural convection of air over an outer surface of the chassis base 60. At the same time the chassis base 60 functions as a supporter that supports the plasma display panel 30 disposed in front of the chassis base 60 and the circuit substrates 71 disposed on a rear surface of the chassis base 60. Therefore, the chassis base 60 is required to have a mechanical strength greater than a predetermined level to safely protect the plasma display panel 30 and the circuit substrates 71 from an unexpected external impact. Meanwhile, the chassis base 60, formed of an electrically conductive material, has a wide area to provide a grounding region that maintains a constant ground voltage, and the circuit substrates 71 mounted on the rear surface of the chassis base 60 have a grounding structure that is directly electrically connected to the chassis base 60 through screw members 80 coupled to the chassis base 60.

To manufacture the chassis base 60, a method of die-casting or pressing an aluminum material to a predetermined shape is used. Accordingly method, the cost of raw materials required is high, thereby increasing manufacturing costs. Also, the chassis base 60 formed of an aluminum material is susceptible to bending or twisting due to its material characteristics. Therefore, when an external impact is applied to the plasma display module during transportation or moving, the plasma display panel 30 and the circuit substrates 71 cannot be protected by the chassis base 60, and therefore, may be damaged by the external impact. In particular, as the size of the plasma display panel 30 increases, the size of the chassis base 60, which is proportional to the size of the plasma display panel 30, also increases, and therefore, becomes more susceptible to bending or twisting. Therefore, an additional reinforcing structure 61 or reinforcing member 65 for protecting the plasma display panel 30 is required.

Also, in that situation, the thickness of the chassis base 60, generally formed of aluminum, must be increased to ensure a predetermined strength. However, the increased thickness is undesirable for making a slim display module. Furthermore, the chassis base 60, formed of an aluminum material having a specific gravity of approximately 2.7, increases the total weight of the display module. Overall, the chassis base 60, formed of an aluminum material, is a limiting factor in making a lightweight and slim plasma display module.

Figure 2:
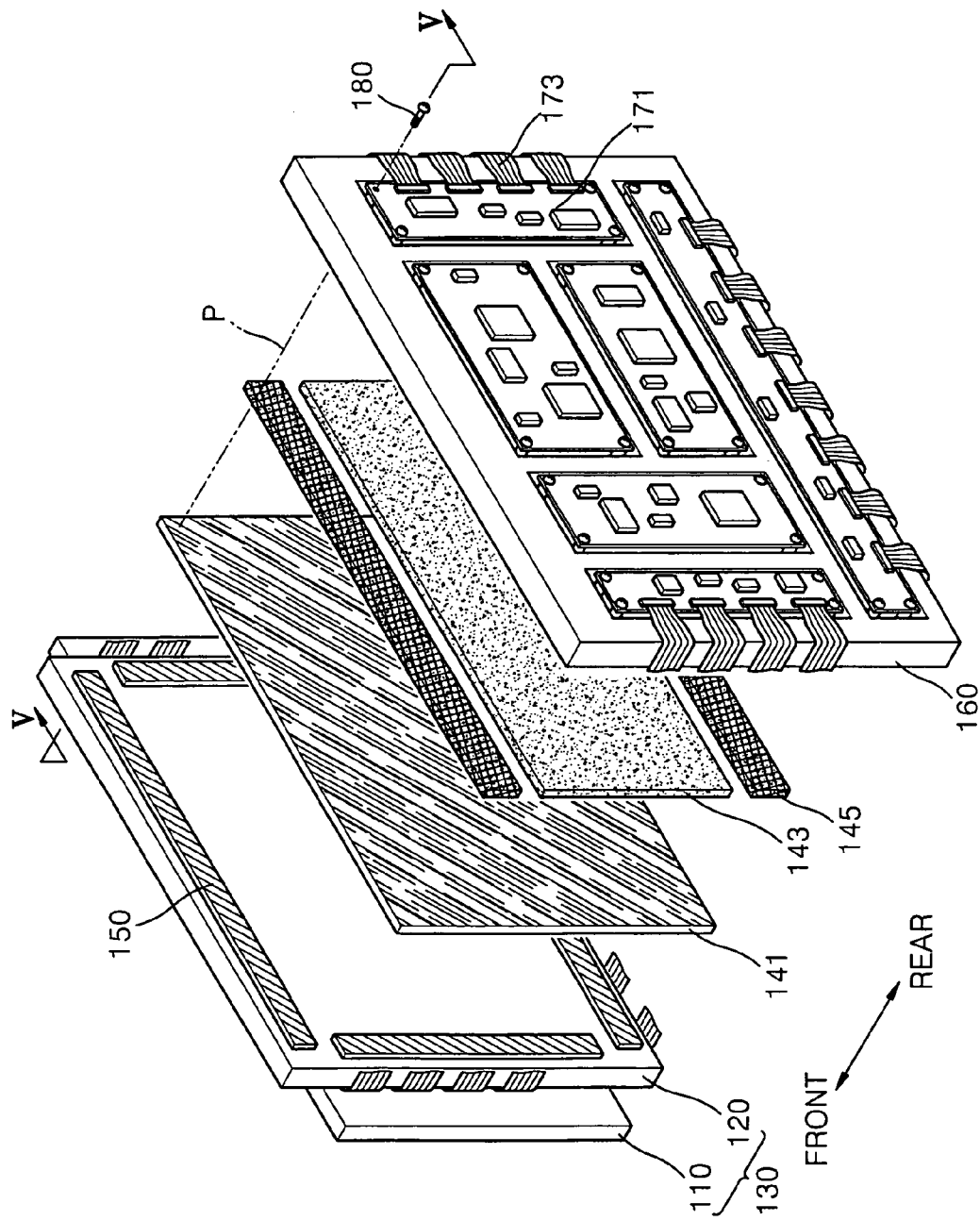
FIG. 2 is an exploded perspective view of a plasma display module, according to an embodiment of the present invention.

FIG. 2 is an exploded perspective view of a plasma display module according to an embodiment of the present invention.

Referring to FIG. 2, the plasma display module includes a plasma display panel 130 forming a front portion of the plasma display module, a chassis base 160 disposed behind the plasma display panel 130, and a grounding member 141 interposed between the plasma display panel 130 and the chassis base 160. The plasma display panel 130 includes a first panel 110 and a second panel 120, and is an image display unit where images are displayed using a discharge effect.

The plasma display panel 130 and circuit substrates 171 in front of and behind the chassis base 160, respectively, are supported by the chassis base 160. In the present invention, the chassis base 160 may be formed of a non-metallic material or a plastic material, for example, a thermoplastic resin material such as polypropylene, polyamide, etc. or thermosetting resin material such as phenol, epoxy, etc. Also, the chassis base 160 may be formed of a material comprising at least two different resins, or a material comprising a resin as a main component and an additive as a functional material to obtain some desired properties such as moldability, strength, or heat-resistance. The chassis base 160 formed of a plastic material can be formed using an injection molding method.

It is known that plastic materials are relatively inexpensive, lightweight and have high strength and good moldability, and therefore, there are various advantages to forming the chassis base 160 from a plastic material, such as productivity of the plasma display modules can be increased, slim and lightweight plasma display modules can be produced, and the plasma display modules can be protected from external impacts since the resistance to bending and twisting is high.

Figure 3:
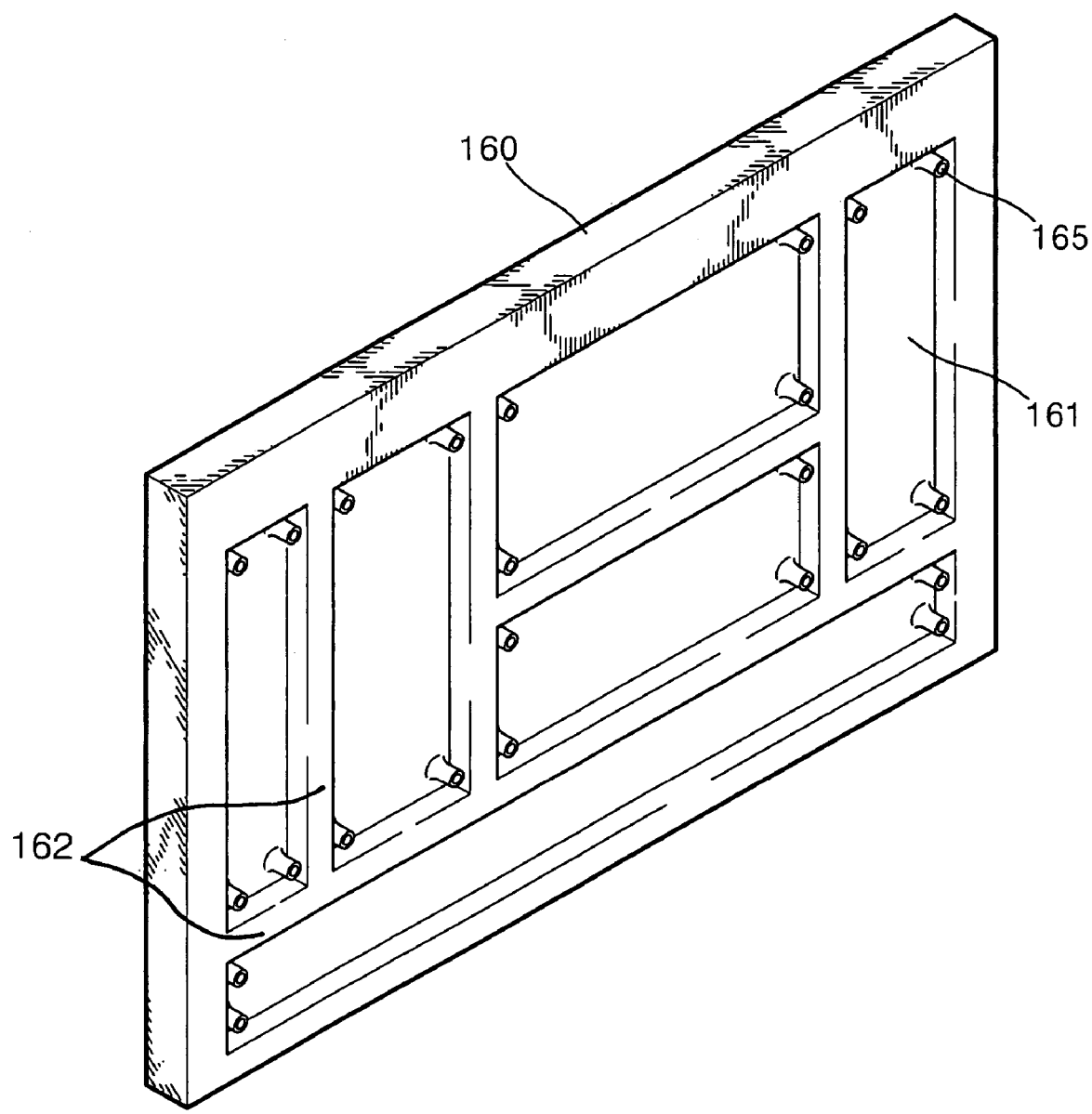
FIG. 3 is a perspective view of a chassis base of FIG. 2, according to an embodiment of the present invention.

FIG. 3 is a perspective view of the chassis base 160 of FIG. 2 according to an embodiment of the present invention. Referring to FIG. 3, recesses 161 having an approximately rectangular shape corresponding to a shape of the circuit substrates 171 and coupling bosses 165 are formed as integral parts of the chassis base 160 wherein the coupling bosses 165 protrude a predetermined distance from a rear surface of the chassis base 160 near each corner of the recesses 161.

The material of chassis base 160 framing each of the recesses 161 form ribs 162 which add to the overall strength and rigidity of the chassis base, and chassis base 160 is made lighter due to the formation of the recesses 161.

The coupling bosses 165 are used to mount the circuit substrates 171 (see in FIG. 2). Screw members 180 (see in FIG. 2) used to fix the circuit substrates 171 on the rear surface of the chassis base 160 are coupled to the coupling bosses 165.

Referring again to FIG. 2, the circuit substrates 171 mounted on the rear surface of the chassis base 160 generate a variety of different driving signals. To do this, a ground voltage as a uniform base voltage must be applied to the circuit substrates 171. The grounding structure of the circuit substrates 171 will be described later. The driving signals generated by the circuit substrates 171 are applied to the plasma display panel 130 through connection cables 173 which extend from the circuit substrates 171.

A grounding member 141 is interposed between the plasma display panel 130 and the chassis base 160. The grounding member 141 has a wide area in order to supply a uniform ground voltage to the circuit substrates 171 that drive the plasma display panel 130.

In the current embodiment of the present invention, the grounding member 141 for grounding the circuit substrates 171 is provided because the chassis base 160 is formed of a plastic insulating material in the present invention. The grounding member 141 may be formed of a metal having high electrical conductivity, for example, a thin aluminum film or a thin copper film. The screw members 180 used to fix the circuit substrates 171 to the chassis base 160 are electrically connected to the grounding member 141 through the chassis base 160. Therefore, the circuit substrates 171 are grounded through the screw members 180 that electrically connect the grounding region of the circuit substrates 171 to the grounding member 141. Here, the screw members 180 fix each corner of the circuit substrates 171 to the chassis base 160. In this state, all screw members 180 that fix the circuit substrates 171 on the chassis base 160 may be electrically connected to the grounding member 141, or, only some of the screw members 180 may be used for grounding the circuit substrates 171 and the rest of the screw members 180 may be used only for fixing the circuit substrates 171 on the chassis base 160. Of course, the screw members 180 that are used for grounding the circuit substrates 171 may also be used for fixing the circuit substrates 171 to the chassis base 160.

Since the plasma display panel 130 displays images using a discharge effect, a large amount of heat is generated during the operation of the plasma display panel 130. If the heat is not rapidly dissipated, various electronic devices mounted on the plasma display panel 130 or the circuit substrates 171 may be degraded, thereby adversely affecting operation of the plasma display module. Accordingly, a heat dissipation member having high thermal conductivity may be attached to the plasma display panel 130. When the grounding member 141 according to the present invention is formed of a metal, the grounding member 141 can also function as the heat dissipation member. For example, since aluminum, which has thermal conductivity of 140 W/mk, dissipates heat very well, the grounding member 141 formed of aluminum can rapidly diffuse heat generated from the plasma display panel 130 in a plane direction.

Although it is not a required element in the present invention, a flexible thermal conductive member 143 may be interposed between the grounding member 141 and the chassis base 160. The flexible thermal conductive member 143 may be formed of a flexible material having a certain degree of thermal conductivity, for example, silicon sheet. The flexible thermal conductive member 143 is tightly interposed between the grounding member 141 and the chassis base 160 to transmit heat there between. That is, an air layer in the flexible thermal conductive member 143 can be compressed when the plasma display panel 130 and the chassis base 160 are tightly coupled, and thus, the air of a heat dissipation path can be removed from the plasma display module to the outside.

The flexible thermal conductive member 143 has a damping capability as it is formed of a flexible material, and therefore, can absorb a vibration or an external impact. Therefore, the flexible thermal conductive member 143 can function to protect the plasma display panel 130, formed of glass, from vibration generated during transportation or moving of the plasma display module by absorbing the vibration. In addition the flexible thermal conductive member 143 can prevent any vibration and noise generated by the plasma display panel 130 being transmitted outside of the plasma display module.

Also, if the flexible thermal conductive member 143 is formed of a material having adhesiveness, the flexible thermal conductive member 143 can intermediate a mechanical coupling between the grounding member 141 and the chassis base 160. Generally, the flexible thermal conductive member 143 has a lower thermal conductivity than the grounding member 141, for example, silicon sheet used to form the flexible thermal conductive member 143 has a thermal conductivity of approximately 1 to 5 W/mk. Accordingly, it is of benefit to the heat dissipation of the plasma display panel 130 that the thickness of the flexible thermal conductive member 143 is limited according to the required flexibility.

The flexible thermal conductive member 143, formed of an electrical insulator, may not be disposed in front of the screw members 180 so that the flexible thermal conductive member 143 does not block an electrical grounding path P between the screw members 180 and the grounding member 141. Referring to an example depicted in FIG. 2, the flexible thermal conductive member 143 and a flexible connection member 145, which itself forms a portion of the grounding path P and will be described later, may be interposed in different areas between the grounding member 141 and the chassis base 160 as to not overlap each other.

The flexible connection member 145 together with the flexible thermal conductive member 143 can be interposed between the grounding member 141 and the chassis base 160. In the example depicted in FIG. 2, the two flexible connection members 145 are disposed on upper and lower extremities of the flexible thermal conductive member 143. Although it is not a required element in the present invention, the provision of the flexible connection member 145 is of benefit to grounding safety. The flexible connection member 145 is tightly sandwiched between the grounding member 141 and the chassis base 160 to form a grounding path P therebetween. For this purpose, the flexible connection member 145 is formed to have flexibility or buffering capability together with electrical conductivity.

Figure 4:
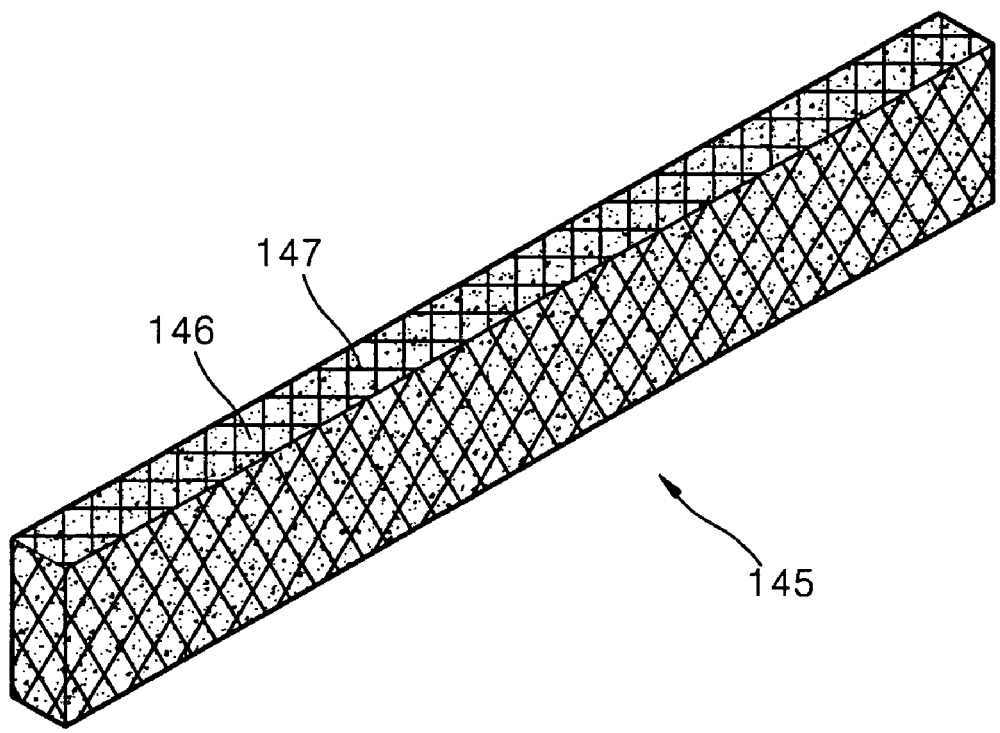
FIG. 4 is a perspective view of a flexible connection material of FIG. 2, according to an embodiment of the present invention.

FIG. 4 is a perspective view of the flexible connection member 145 of FIG. 2, according to an embodiment of the present invention. As depicted in FIG. 4 the flexible connection member 145 can be formed of a conductive sponge. The conductive sponge depicted in FIG. 4 includes a sponge 146 that allows flexibility and a metal mesh 147 that surrounds the exterior of the sponge 46 and provides electrical conductivity.

As shown in FIG. 2, strips of double-sided tape 150 are attached along outer areas of the grounding member 141 between the plasma display panel 130 and the chassis base 160. The plasma display module is assembled by applying a pressure between the plasma display panel 130 and the chassis base 160 when the strips of double-sided tape 150 are interposed there between.

Figure 5:
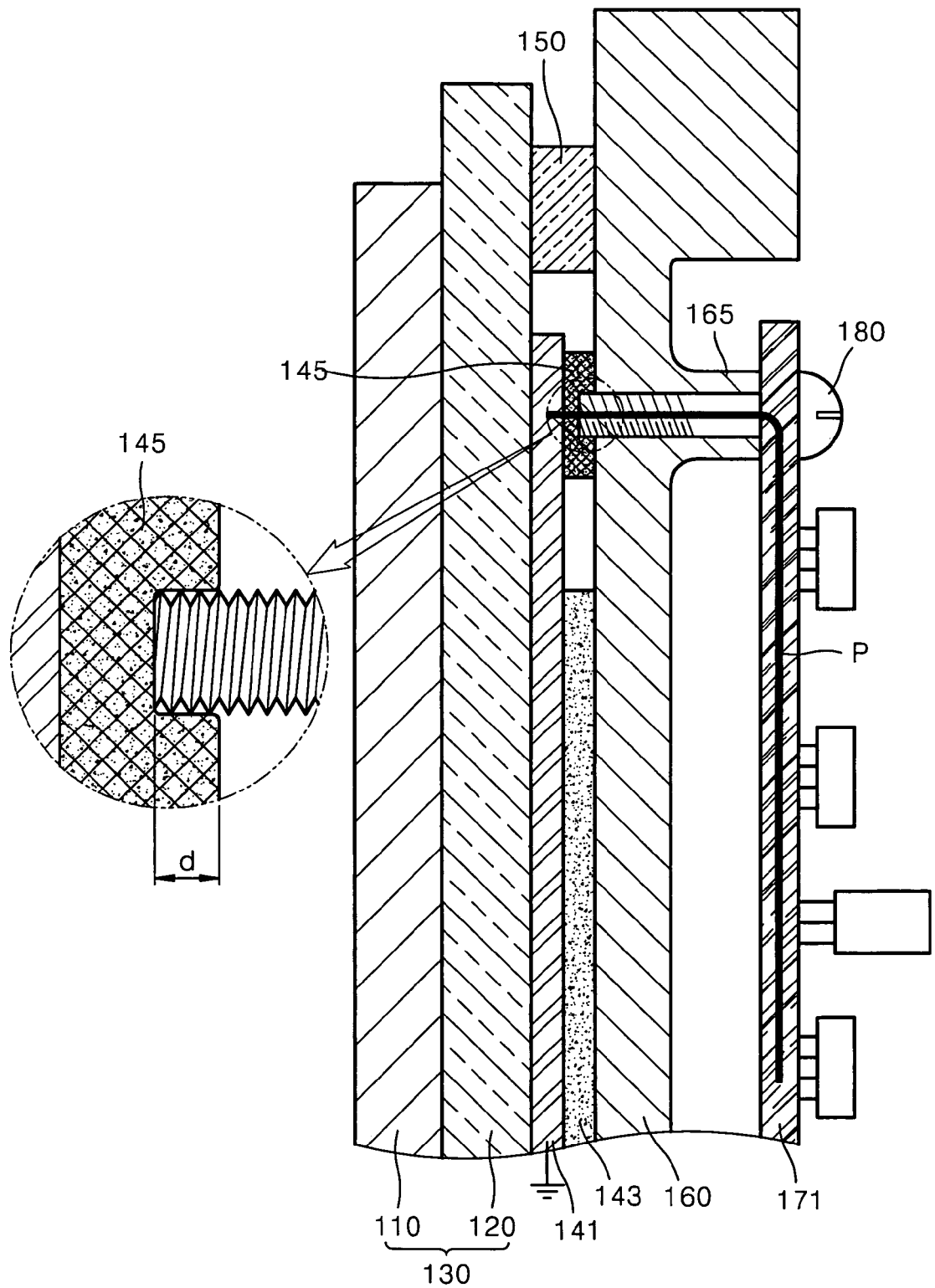
FIG. 5 is a cross-sectional view of the plasma display module taken along line V-V of FIG. 2, according to an embodiment of the present invention.

FIG. 5 is a partial cross-sectional view of the plasma display module taken along line V-V of FIG. 2, according to an embodiment of the present invention.

Referring to FIG. 5, the grounding member 141 and the flexible connection member 145 that contacts the grounding member 141 are interposed between the plasma display panel 130 and the chassis base 160. Coupling bosses 165 are formed as an integral part of the chassis base 160 on a rear surface of the chassis base 160. Each circuit substrate 171 is fixed on the rear of the chassis base 160 by coupling the screw members 180 to the coupling bosses 165 through the circuit substrate 171. Each coupling boss 165 has a screw hole in which an internal screw thread is formed, and the screw member 180 coupled to the coupling boss 165 may protrude a predetermined depth d from the side of the chassis base 160. As a result, the screw member 180 can contact the flexible connection member 145 with a predetermined pressure. The flexible connection member 145 pressed by the screw member 180 tightly contacts the grounding member 141, and intermediates an electrical connection between the screw member 180 and the grounding member 141.

Since the flexible connection member 145 is tightly interposed between the screw member 180 and the grounding member 141, a connection failure between the screw member 180 and the grounding member 141 does not occur despite any assembling or manufacturing errors and a predetermined margin of error for stable connection can be ensured. The flexible connection member 145 completes a grounding path P of the circuit substrate 171 by electrically connecting the screw member 180 to the grounding member 141, and thus, the circuit substrate 171 is grounded to the grounding member 141 through the screw member 180 and the flexible connection member 145.

In the plasma display module according to the present invention, a plastic material which is inexpensive and lightweight, and has high strength and good moldability is used to form the chassis base. Therefore, productivity of the plasma display modules can be increased, slim and lightweight plasma display modules can be produced, and the plasma display modules can be protected from external impacts since resistance to bending and twisting is high.

In particular, in the present invention, since the chassis base is formed of an insulating material, a metal thin film grounding member is provided to serve as a grounding member instead of the chassis base as in the prior art, and a new grounding structure in which the circuit substrate and the grounding member are electrically connected is provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A plasma display module comprising:
a chassis base formed of a non-metallic material;
a plasma display panel disposed in front of the chassis base to display images;
a plurality of circuit substrates disposed on a rear surface of the chassis base to drive the plasma display panel;
a grounding member disposed between the chassis base and the plasma display panel, the grounding member being formed of a conductive material so that the grounding member can provide a ground voltage to the circuit substrates when the circuit substrates are grounded to the grounding member; and a plurality of screw members fixing the circuit substrates to the chassis base, at least one of said screw members grounding circuit substrates to the grounding member by electrically connecting the circuit substrates to the grounding member through the chassis base.

2. The plasma display module of claim 1, further comprising:
a flexible connection member having a buffering capability together with electrical conductivity, said flexible connection member being interposed between the chassis base and the grounding member, said flexible connection member forming an electrical connection between said at least one screw member and the grounding member.

3. The plasma display module of claim 2, wherein said at least one screw member protrudes a predetermined distance from the chassis base so that the screw member can elastically press the flexible connection member against said grounding member.

4. The plasma display module of claim 2, wherein the flexible connection member is formed of a sponge and a metal mesh that surrounds the sponge.

5. The plasma display module of claim 2, wherein the flexible connection member is formed of a sponge and a metal mesh that surrounds the sponge.

6. The plasma display module of claim 1, further comprising:
a flexible thermal conductive member having a buffering capability together with thermal conductivity, said flexible thermal conductive member being tightly sandwiched between the chassis base and the grounding member so that the flexible thermal conductive member can intermediate heat transfer from the chassis base to the grounding member.

7. The plasma display module of claim 6, wherein the flexible thermal conductive member is formed of silicon sheet.

8. The plasma display module of claim 1, wherein the grounding member has a high degree of thermal conductivity for rapidly diffusing heat generated from the plasma display panel.

9. The plasma display module of claim 8, wherein the grounding member is formed of aluminum.

10. The plasma display module of claim 1, further comprising:
a flexible connection member that intermediates electrical connection by being tightly sandwiched between the grounding member and one of the screw members that has passed through the chassis base; and
a flexible thermal conductive member that intermediates heat transfer by being tightly sandwiched between the grounding member and the chassis base, said flexible connection member and said flexible thermal conductive member each being interposed in different areas between the grounding member and the chassis base.

11. The plasma display module of claim 1, wherein the chassis base comprises:
a plurality of recesses formed in a rear surface area of the chassis base for receiving said plurality of circuit substrates; and
a plurality of coupling bosses for receiving said plurality of screw members, said coupling bosses being formed as an integral part of the chassis base protruding from said recesses.

12. The plasma display module of claim 11, wherein the chassis base further comprises:
a plurality of ribs framing said plurality of recesses, said ribs providing added strength and rigidity to said chassis base.

13. The plasma display module of claim 1, wherein the non-metallic material forming the chassis base is comprised of a plastic material.

14. The plasma display module of claim 1, wherein the non-metallic material forming the chassis base is comprised of a thermoplastic resin material or a thermosetting resin material.

15. A plasma display module comprising:
a plasma display panel;
a chassis base formed of a non-metallic material, said chassis base being fastened to said plasma display panel by double sided tape disposed adjacent outer edges of said plasma display panel;
a plurality of circuit substrates disposed on a rear surface of the chassis base to drive the plasma display panel;
a grounding member disposed between said plasma display panel and said chassis base, said grounding member being formed of a conductive material; and
a plurality of screw members fixing said plurality of circuit substrates to the chassis base, at least one of said screw members grounding said circuit substrates to the grounding member by electrically connecting the circuit substrates to the grounding member through the chassis base.

16. The plasma display module of claim 15, wherein the non-metallic material forming the chassis base is comprised of a plastic material.

17. The plasma display module of claim 15, wherein the non-metallic material forming the chassis base is comprised of a thermoplastic resin material or a thermosetting resin material.

18. The plasma display module of claim 15, wherein the chassis base comprises:
a plurality of recesses formed in a rear surface area of the chassis base for receiving said plurality of circuit substrates; and
a plurality of coupling bosses for receiving said plurality of screw members, said coupling bosses being formed as an integral part of the chassis base protruding from said recesses.

19. The plasma display module of claim 18, wherein the chassis base further comprises:
a plurality of ribs framing said plurality of recesses, said ribs providing added strength and rigidity to said chassis base.

20. The plasma display module of claim 15, further comprising:
flexible connection members having a buffering capability together with electrical conductivity, said flexible connection members being tightly sandwiched between the chassis base and the grounding member, at least one of said flexible connection members forming an electrical connection between said at least one screw member and the grounding member; and
a flexible thermal conductive member disposed between said flexible connection members, said flexible thermal conductive member having a buffering capability together with thermal conductivity, said flexible thermal conductive member being tightly sandwiched between the chassis base and the grounding member so that the flexible thermal conductive member can intermediate heat transfer from the chassis base to the grounding member.

* * * * *